(12) United States Patent
Rather et al.

(10) Patent No.: US 7,439,769 B1
(45) Date of Patent: Oct. 21, 2008

(54) PROGRAMMING LOGIC DEVICE AND METHOD FOR PROGRAMMING THE SAME

(75) Inventors: Michael Rather, San Francisco, CA (US); James G. Schleicher, II, Los Gatos, CA (US)

(73) Assignee: Altera Corporation, San Jose, CA (US)

(*) Notice: Subject to any disclaimer, the term of this patent is extended or adjusted under 35 U.S.C. 154(b) by 22 days.

(21) Appl. No.: 11/677,476

(22) Filed: Feb. 21, 2007

(51) Int. Cl.
H03K 19/177 (2006.01)
(52) U.S. Cl. .......................... 326/41; 326/38; 707/203; 717/170
(58) Field of Classification Search ................. 326/37, 326/38, 41; 707/203; 717/170
See application file for complete search history.

(56) References Cited

U.S. PATENT DOCUMENTS

| | | | |
|---|---|---|---|
| 6,490,714 B1 | 12/2002 | Kurniawan et al. | |
| 2006/0010175 A1* | 1/2006 | Kwong | 707/203 |
| 2006/0017458 A1 | 1/2006 | Lawson et al. | |
| 2006/0119386 A1 | 6/2006 | Ng et al. | |
| 2006/0288009 A1 | 12/2006 | Pieper et al. | |

OTHER PUBLICATIONS

Stephen Brown, Jonathan Rose, "Architecture of FPGAs and CPLDS: A Tutorial," *Department of Electrical and Computer Engineering, University of Toronto.*

* cited by examiner

*Primary Examiner*—Daniel D Chang
(74) *Attorney, Agent, or Firm*—Martine Penilla & Gencarella, LLP

(57) ABSTRACT

The present invention is directed to a programmable logic device and a method of programming a programmable logic device that features providing a verification technique to ensure the requisite functional operations of an array of configurable logic blocks may be programmed while limiting a user from altering the functional operations of the configurable logic blocks of the programmable logic device to having functional operations in addition to and/or different from the functional operations of that a vendor desires a user to have. In this manner, the array of configurable logic blocks can be designed so that the same may be programmed to provide one or more of multiple different functional operations, while limiting a user to a desired set of functional operations.

20 Claims, 4 Drawing Sheets

PROGRAMMING LOGIC DEVICE AND METHOD FOR PROGRAMMING THE SAME

BACKGROUND

The present invention relates to programming of programmable logic devices.

Referring to FIG. 1, programmable logic devices (PLDs) are digital logic circuits that can be programmed to perform a variety of logical functions. A specific logical function is programmed into a programmable logic device by a user. The user may subsequently overwrite the initial logical function with a new logical function. To that end, a programmable logic device 10 includes a set of configurable logic blocks 12 and a control block 14. A programming pattern 16 is programmed into the configurable logic blocks 12 through an external programming apparatus 18. The external programming apparatus 18 known in the art that generates an appropriate set of programmable voltages. External programming apparatus 18 facilitates providing accurate information regarding the parameters required to program configurable logic blocks 12 to obtain the desired functional operation of the programmable logic device 10. As is well known in the art external programming apparatus 18 provides configurable logic blocks with a designated voltage for a predetermined interval of time during the programming process. This results in configurable logic blocks 12 providing a desired functional operation of programmable logic device 10. To that end, programming pattern 16 is applied via external programming apparatus 18 to control block 14. Control block 14 generates a multitude of signals that are used to program configurable logic blocks in accordance with programming pattern 16.

An important requirement is to ensure that programmable logic device 10 is programmed to provide the desired functional operation. to that end, programming pattern 16 includes configuration file identification along with the programming pattern. Control block 14 includes silicon programmable logic device identification. This configuration file identification is compared with the silicon programmable logic device identification to determine whether the two match. Where the two are found to match, control block 14 would allow programming of configurable logic blocks 12 to occur in accordance with programming pattern of 16 under control of external programming apparatus 18. Otherwise, were the configuration file identification found not to match the silicon programmable logic device identification programming access to configurable logic blocks 12 would be denied by control block 14. During the programming process typically any configuration file can typically be programmed into the device and any of the resources configurable logic blocks 12 can be used without any ability of logic device 10 manufacturer to restrict certain usage.

A need exist, therefore, to improve programming characteristics of programmable logic devices.

SUMMARY

It should be appreciated that the present invention can be implemented in numerous ways, such as a process, an apparatus, a system, a device or a method on a computer readable medium. Several inventive embodiments of the present invention are described below.

The present invention is directed to a programmable logic device and a method of programming a programmable logic device that features providing a verification technique to ensure the requisite functional operation of an array of configurable logic blocks may be programmed while limiting a user from changing the functional operation of the configurable logic blocks of the programmable logic device (PLD). In this manner, the array of configurable logic blocks can be designed so that the same may be programmed to provide one or more of multiple different functional operations, while limiting a user to a desired functional operation. This reduces the incremental manufacturing cost of the multiple programmable logic device products by enabling a single programmable logic device to take on the characteristics of multiple programmable logic device products, while providing the flexibility to satisfy different functional operations desired by a number of different users. To that end, a method in accordance with one embodiment of the present invention includes receiving a configuration file including configuration file identification (CFI), configuration version identification (CVI) and configuration data. The configuration data specifies the functional operations to be performed by a subset of a plurality of configurable logic blocks. The CVI is compared with a PLD version identification (PLDVI) to determine whether the specified configuration data will enable a authorized subset of the functionality associated with the programmable logic device product being used. Configuration of the programmable logic device will only be allowed to succeed if the CVI and the PLDVI are found to match. Otherwise, programming access to the PLD is denied, e.g., were it found that the CVI and the PLDVI did not match. Also disclosed is a programmable logic device of functions in accordance with the operations of the method. These and other aspects of the invention will become apparent from the following detailed description, taken in conjunction with the accompanying drawings, illustrating by way of example the principles of the invention.

DETAILED DESCRIPTION OF THE INVENTION

Figure 1:
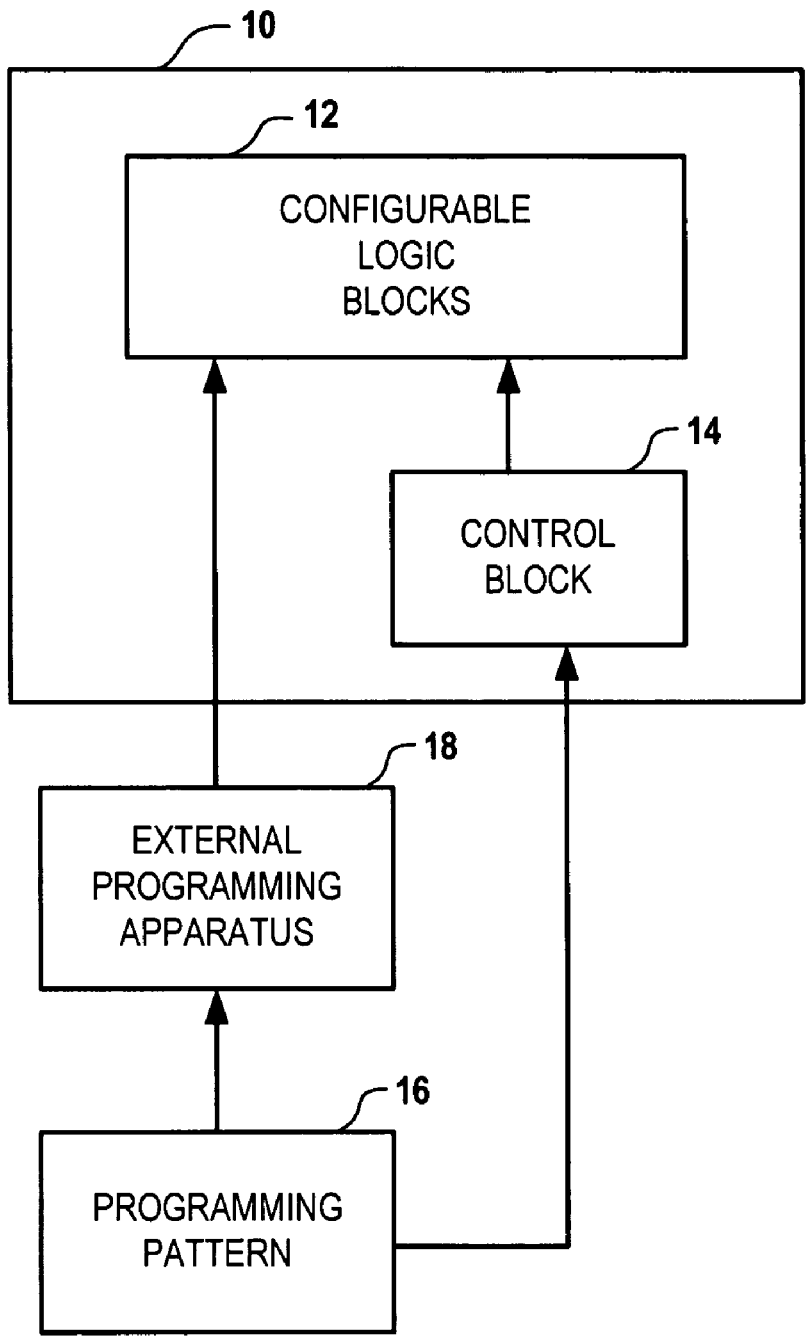
FIG. 1 is a simplified plan view of a programmable logic device and external programming apparatus in accordance with the prior art.
Figure 2:
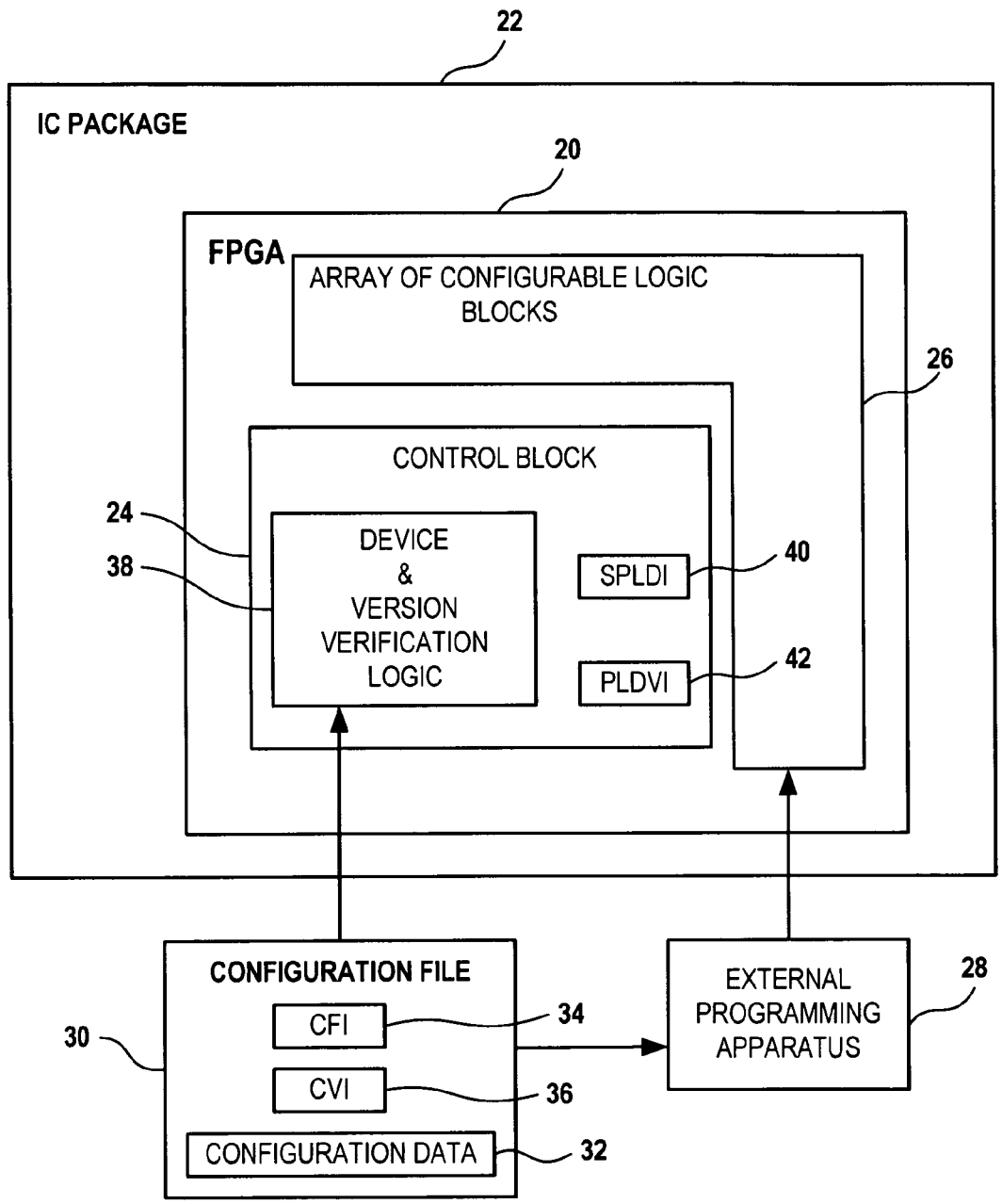
FIG. 2 is a simplified plan review of a programmable logic device and an external programming apparatus in accordance with the present invention.

Referring to FIG. 2, the present invention is implemented with respect to programming a field programmable gate array 20 (FPGA), which is usually included in an integrated circuit package 22. FPGA 20 includes a control block 24 and an array of configurable logic blocks 26 in electrical communication with control block 24. Control block 24 generates signals used to program configurable logic blocks of array 26 using techniques well known in the art. To that end, an external programming apparatus 28 is in data communication with both array 26 and a configuration file 30. Configuration file 30 includes configuration data 32 that is typically written in binary format and provides control information to both control block 24 and an external programming apparatus 28 so that array 26 may be provided with desired functional operations.

Figure 3:
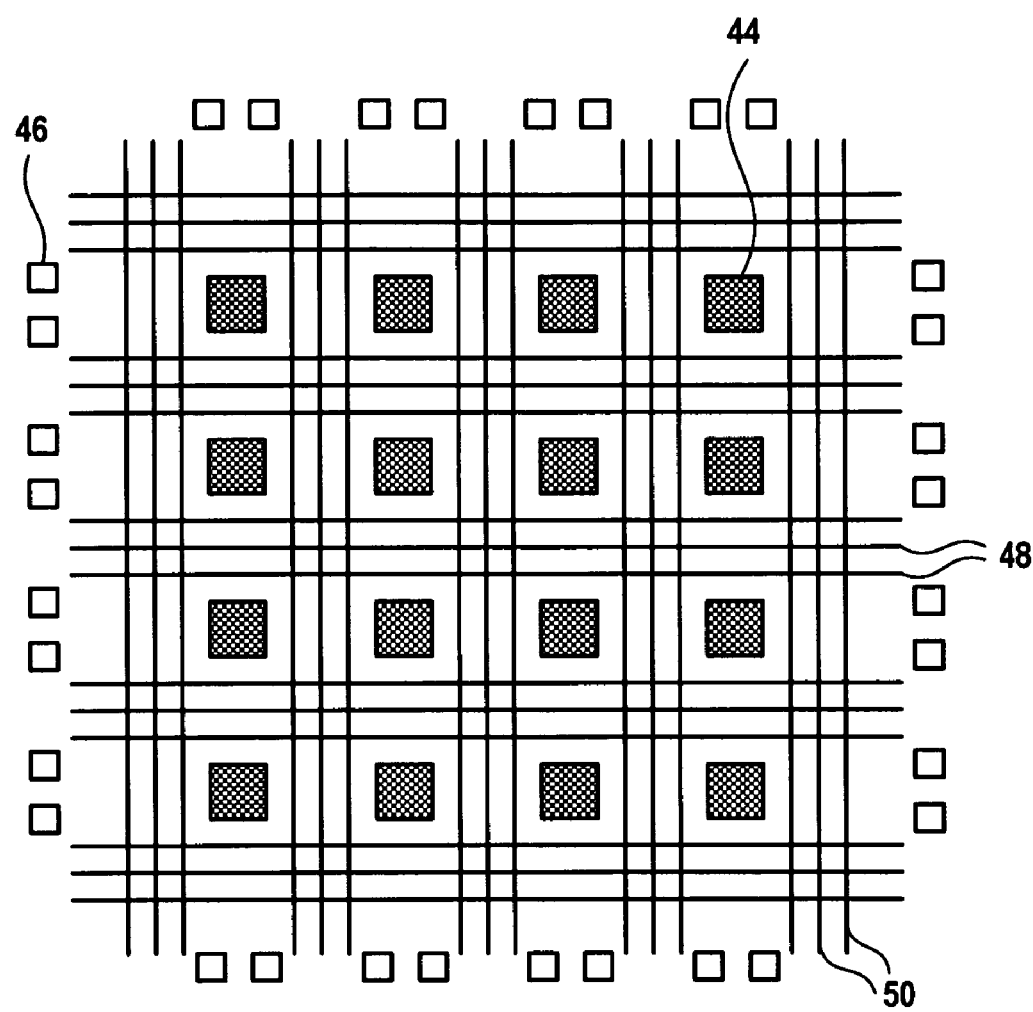
FIG. 3 is a detailed view of an array of configurable logic blocks, shown in FIG. 2, in accordance with the present invention.

Referring to both FIGS. 2 and 3, array 26 includes a plurality programmable switch elements 44 in data communication with input-output (I/O) circuits 46 through line segments 48 and 50. The structural configuration of each of switch elements 44 maybe any known in the art so as to provide desired logic operations, such as AND operations, OR operations and Flip-Flop operations. The logic operations are interconnected to provide desired functional operations of array 26 and, therefore, FPGA 20. Examples of desired functional operations include D-Flip-Flops, J-K Flip-Flop, arithmetic logic units and the like. Examples of FPGAs that may be programmed in accordance with the present invention are available from Altera Corporation of San Jose, Calif. under the trade names STRATIX® AND CYCLONE®.

To provide FPGA 20 with the desired functional operations, configuration file 30 must include configuration data 32 appropriate for the structural layout of array 26. To that end, control block 24 ensures that configuration data 32 is appropriate by comparing a configuration file identification (CFI) 34 included in configuration file 30 with silicon programmable logic device information (SPLDI) 40 stored in control block 24. To that end, control block 24 includes device and version verification logic (VVL) 38. VVL 38 may consist of software or firmware that functions to compare CFI 34 with SPLDI 40 to determine whether the same match. Were it found that CFI 34 matched SPLDI 40, control block 24 would allow array 26 to be programmed by external programming apparatus 28 in accordance with configuration data 32 to provide the desired functional operations to FPGA 20.

An advantage provided by the current invention is that FPGA 20 may be fabricated with an array 26 programmed to provide any one or more of numerous different functional operations, while limiting access to only a subset of the functional operations for which array may be programmed to perform. This provides greater efficiency and economies of scale when manufacturing FPGA 20 through minimization of development costs, maximizing the variety of functional operations that may be selectively provided by FPGA 20. As a result, FPGA 20 may be programmed with user specific functional operations tailored for a specific user, while preventing access by the user of non-user specific functional operations and without incurring development costs associated with manufacturing an FPGA that provides only the user specific desired functional operations. This is achieved by implementing additional verification of configuration data 32 compatibility with FPGA 20. To that end, control block 24 includes VVL 38 that determines whether configuration data 32 will provide functional operations to FPGA 20 that have been authorized by the manufacturer of FPGA 20. Afforded is an extra level of control with respect to the functional operations that may be provided to FPGA 20, which is independent of the ability of FPGA 20 to provide functional operations in addition to or different from, the functional operations desired by a user. As a result, programming array 26 in accordance with the instructions set forth in configuration data file 30 may be prevented in the presence of CFI 34 matching SPLDI 40 were a user attempting to program array 26 to provide FPGA 20 with functional operations that the manufacturer of FPGA 20 did not contract with the user to have To prevent a user of FPGA 20 from providing the FPGA 20 with functional operations that a manufacturer, or vendor, of FPGA 20 did not desire the user to have, control block 24 includes programmable logic device version identification (PLVDI) 42. VVL 38 operates to identify, in configuration file 30, a configuration version identification (CVI) 36 and compare PLVDI 42 with CVI 36 to determine whether programming of array 26 may be undertaken with configuration file 30. Were VVL 38 to determine that PLVDI 42 and CVI 36 did not match, programming of array 26 would be denied. Otherwise, array 26 could be programmed under control configuration file 30 to provide FPGA 20 with the operational characteristics resulting from the programming process. As a result, PLDVI 42 defines which combination of switch elements 44 that may be utilized and/or interconnected with adjacent switch elements 44, as well as the overall functional operations that may be performed by FPGA 20. PLVDI 42 may be defined using any known technique in the art, including encoding devices such as poly fuses, a non-volatile memory and the like.

Figure 4:
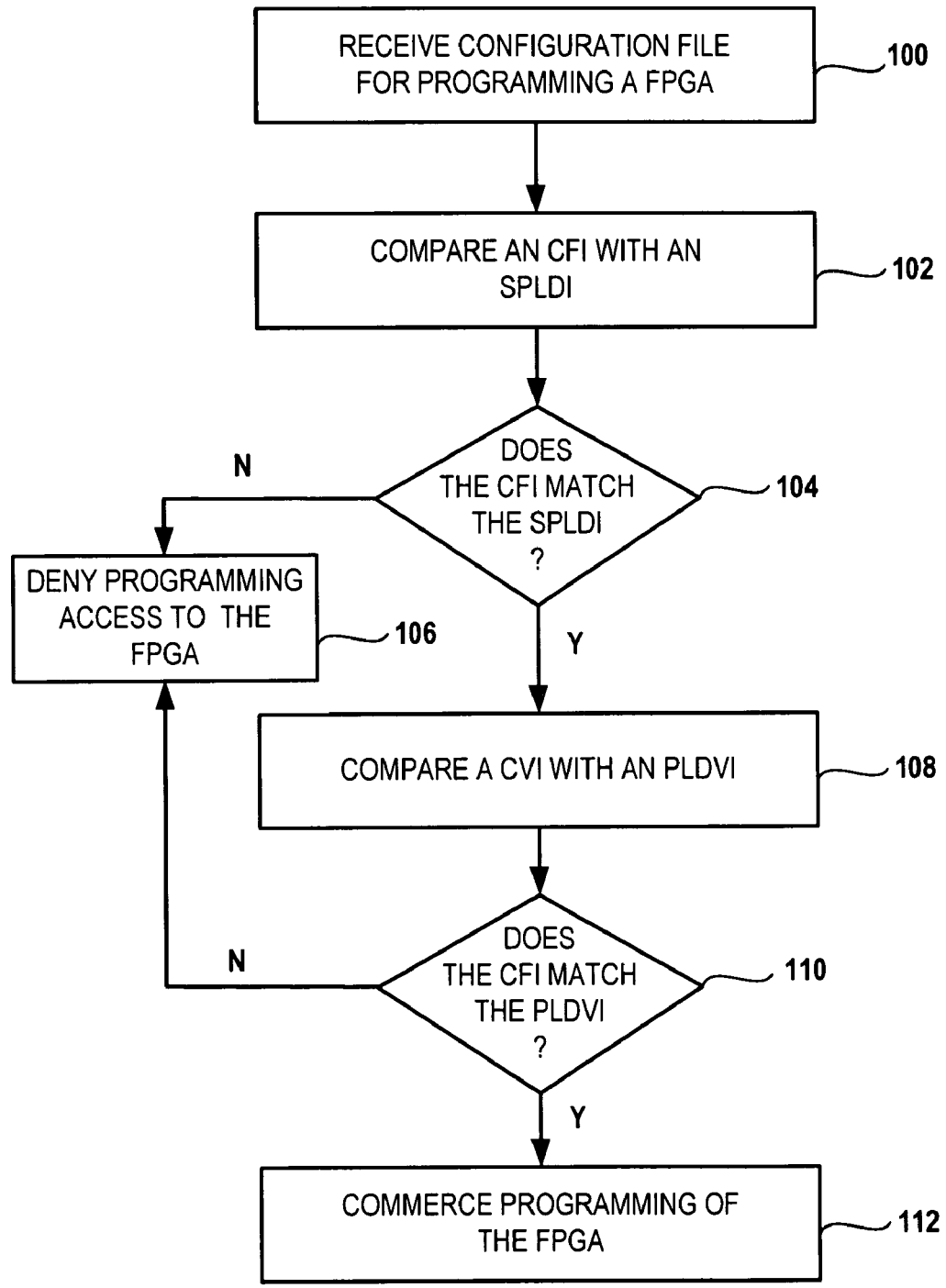
FIG. 4 is a flow diagram showing a process of programming a programmable logic device in accordance with the present invention.

Referring to FIGS. 2 and 4, during a programming process, configuration file 30 is passed from the external programming apparatus 28, to the VVL 38 at function 100. At function 102, VVL 38 identifies and compares CFI 34, included in configuration file, with SPLDI 40. At function 104, VVL 38 determines whether CFI 34 matches SPLDI 40. Were a match not found at function 104, programming access to FPGA 20 would be denied at function 106. Otherwise, VVL 38 identifies and compares CVI 36, included in configuration file 30, with PLDVI 42 at function 108. At function 110, VVL 38 determines whether CVI 36 matches PLDVI 42. Were a match not found at function 110, programming access to FPGA 20 would be denied at function 16. Otherwise programming of array 26 would commence, at function 112, to provide FPGA 20 with functional operations in accordance with the instructions of configuration data 32 contained in configuration file 30.

Although the foregoing invention has been described in some detail for purposes of clarity of understanding, it will be apparent that certain changes and modifications may be practiced within the scope of the appended claims. Accordingly, the present embodiments described above are to be considered as illustrative and not restrictive, and the invention is not to be limited to the details given herein, but may defined by the appended claims, including full scope of equivalents thereof.

What is claimed is:

1. A method of programming a programmable logic device (PLD) having a plurality of configurable logic blocks, said method comprising:

receiving a configuration file including configuration file identification (CFI), configuration version identification (CVI) and configuration data, said configuration data specifying functional operations to be performed by a subset of said plurality of configurable logic blocks; and comparing said CVI with a PLD version identification (PLDVI) to determine whether said subset of configurable logic blocks are to be programmed to provide said functional operations.

2. The method as recited in claim 1 further including programming said subset of configurable logic blocks were said CVI and said PLDVI found to match.

3. The method as recited in claim 1 further including denying programming access to said PLD were said CVI and said PLDVI found not to match.

4. The method as recited in claim 1 further including comparing said CFI with a silicon PLD identification to determine whether said subset of configurable logic blocks are to be programmed to provide said functional operations.

5. The method as recited in claim 1 further including comparing said CFI with a silicon PLD identification comparing and programming said subset to provide said functional operations upon said CFI matching said silicon PLD identification.

6. The method as recited in claim 1 further including comparing said CFI with a silicon PLD identification before comparing said CVI with said PLDVI.

7. The method as recited in claim 1 wherein said PLD is a Field Programmable Gate Array.

8. A programmable logic device (PLD), comprising:
an array of configurable logic blocks, said array including a PLD version identification (PLDVI);
a control block to receive configuration file that includes a configuration file identification (CFI), configuration version identification (CVI) and configuration data, said configuration data specifying functional operations of a subset of said plurality of configurable logic blocks, said control block including version verification logic (VVL) to compare said CVI with said PLDVI to determine whether said subset of configurable logic blocks are to be programmed to provide said functional operations.

9. The device as recited in claim 8 wherein said VVL is further configured to allow programming said subset of configurable logic blocks were said CVI and said PLDVI found to match.

10. The device as recited in claim 8 wherein said VVL is further configured to deny programming access of said PLD were said CVI and said PLDVI found not to match.

11. The device as recited in claim 8 wherein said VVL is further configured to compare said CFI with a silicon PLD identification to determine whether said CVI is to be compared with said PLDVI.

12. The device as recited in claim 8 wherein said VVL is further configured to compare said CFI with a silicon PLD identification and comparing said CVI with said PLDVI upon said CFI matching said silicon PLD identification.

13. The device as recited in claim 8 wherein said VVL if further configured to compare said CFI with a silicon PLD identification before said CVI is compared with said PLDVI.

14. The device as recited in claim 8 wherein said PLD is a Field Programmable Gate Array.

15. The device as recited in claim 8 wherein said VVL further includes an encoding device to define said CVI, said encoding device being selected from a set encoding devices consisting essentially of poly fuses and a non-volatile memory.

16. A programmable logic device (PLD), comprising:
an array of configurable logic blocks, said array including PLD version identification (PLDVI) and silicon PLD identification (SPLDI); and
a control block to receive configuration data that includes a configuration file identification (CFI), configuration version identification (CVI) and configuration data, said configuration data specifying functional operations to be performed by a subset of said plurality of configurable logic blocks, said control block including version verification logic (VVL) to compare CFI with said SPLDI and, upon finding a match between said CFI and said SPLDI, comparing said CVI with said PLDVI to determine whether said subset of configurable logic blocks are to be programmed to provide said functional operations.

17. The device as recited in claim 16 wherein said VVL is further configured to allow programming said subset of configurable logic blocks were said CVI and said PLDVI found to match.

18. The device as recited in claim 16 wherein said VVL is further configured to deny programming of said PLD were said CVI and said PLDVI found not to match.

19. The device as recited in claim 16 wherein said PLD is a Field Programmable Gate Array.

20. The device as recited in claim 16 wherein said VVL further includes an encoding device to define said CVI, said encoding device being selected from a set encoding devices consisting essentially of poly fuses and a non-volatile memory.

* * * * *